(12) United States Patent
Gan et al.

(10) Patent No.: US 7,091,778 B2
(45) Date of Patent: Aug. 15, 2006

(54) ADAPTIVE WIDEBAND DIGITAL AMPLIFIER FOR LINEARLY MODULATED SIGNAL AMPLIFICATION AND TRANSMISSION

(75) Inventors: Hong Gan, Belle Mead, NJ (US); Anthony Dennis, Belle Mead, NJ (US)

(73) Assignee: M/A-COM, Inc., Lowell, MA (US)

( * ) Notice: Subject to any disclaimer, the term of this patent is extended or adjusted under 35 U.S.C. 154(b) by 22 days.

(21) Appl. No.: 10/666,097

(22) Filed: Sep. 19, 2003

(65) Prior Publication Data

US 2005/0062529 A1   Mar. 24, 2005

(51) Int. Cl.
  *H03G 3/20* (2006.01)
  *H03F 3/68* (2006.01)
(52) U.S. Cl. ............... 330/136; 330/124 R; 330/129; 330/279
(58) Field of Classification Search ............... 330/129, 330/134, 136, 124 R, 295, 278, 279
See application file for complete search history.

(56) References Cited

U.S. PATENT DOCUMENTS

| | | |
|---|---|---|
| 3,978,422 A | 8/1976 | Rheinfelder |
| 4,580,111 A | 4/1986 | Swanson |
| 4,586,000 A | 4/1986 | Wagner |
| 4,646,359 A | 2/1987 | Furrer |
| 5,056,109 A | 10/1991 | Gilhousen et al. |
| 5,257,283 A | 10/1993 | Gilhousen et al. |
| 5,265,119 A | 11/1993 | Gilhousen et al. |
| 5,267,262 A | 11/1993 | Wheatley, III |
| 5,278,997 A | 1/1994 | Martin |
| 5,311,143 A | 5/1994 | Soliday |
| 5,339,046 A | 8/1994 | Kornfeld et al. |
| 5,396,516 A | 3/1995 | Padovani et al. |
| 5,408,697 A | 4/1995 | Price et al. |
| 5,410,280 A | 4/1995 | Linguet et al. |
| 5,437,055 A | 7/1995 | Wheatley, III |
| 5,442,322 A | 8/1995 | Kornfeld et al. |
| 5,452,473 A | 9/1995 | Weiland et al. |
| 5,485,486 A | 1/1996 | Gilhousen et al. |
| 5,576,662 A | 11/1996 | Price et al. |
| 5,577,265 A | 11/1996 | Wheatley, III |
| 5,590,408 A | 12/1996 | Weiland et al. |
| 5,642,002 A | 6/1997 | Mekanik et al. |
| 5,655,220 A | 8/1997 | Weiland et al. |
| 5,661,434 A | 8/1997 | Brozovich et al. ............ 330/51 |
| 5,703,902 A | 12/1997 | Ziv et al. |
| 5,758,269 A | 5/1998 | Wu ........................... 455/127 |
| 5,774,017 A | 6/1998 | Adar |
| 5,812,607 A | 9/1998 | Hutchinson, IV et al. |

(Continued)

FOREIGN PATENT DOCUMENTS

WO   WO 01/10013 A1   2/2001

OTHER PUBLICATIONS

Hulick, "The Digital Linear Amplifier", Schwenksville, Pennsylvania.

(Continued)

*Primary Examiner*—Khanh Van Nguyen

(57) ABSTRACT

An apparatus including an amplitude mapping circuit for converting at least a portion of an amplitude signal to a binary value and a plurality of amplifiers coupled to the amplitude mapping circuit, such that the binary value is transmitted to at least one of the plurality of amplifiers to specify a gain level of the amplifier. The apparatus may be used in a system where an input wave has been divided into amplitude and frequency components.

6 Claims, 3 Drawing Sheets

U.S. PATENT DOCUMENTS

| | | | |
|---|---|---|---|
| 5,818,298 | A | 10/1998 | Dent et al. |
| 5,880,633 | A | 3/1999 | Leizerovich et al. |
| 5,892,431 | A | 4/1999 | Osterman |
| 5,903,554 | A | 5/1999 | Saints |
| 5,930,128 | A | 7/1999 | Dent |
| 5,936,464 | A * | 8/1999 | Grondahl ............... 330/10 |
| 5,939,951 | A | 8/1999 | Bateman et al. |
| 5,942,946 | A | 8/1999 | Su et al. |
| 5,952,895 | A | 9/1999 | McCune, Jr. et al. |
| 5,974,041 | A | 10/1999 | Kornfeld et al. ............ 370/342 |
| 6,043,707 | A | 3/2000 | Budnik |
| 6,043,712 | A | 3/2000 | Leizerovich et al. |
| 6,075,413 | A | 6/2000 | Katakura |
| 6,075,974 | A | 6/2000 | Saints et al. |
| 6,078,628 | A | 6/2000 | Griffith et al. |
| 6,094,101 | A | 7/2000 | Sander et al. |
| 6,097,252 | A | 8/2000 | Sigmon et al. |
| 6,101,224 | A | 8/2000 | Lindoff et al. |
| 6,112,071 | A | 8/2000 | McCune, Jr. |
| 6,133,788 | A | 10/2000 | Dent |
| 6,140,875 | A | 10/2000 | Van Den Homberg et al. |
| 6,140,882 | A | 10/2000 | Sander |
| 6,147,553 | A | 11/2000 | Kolanek |
| 6,157,681 | A | 12/2000 | Daniel et al. |
| 6,178,313 | B1 | 1/2001 | Mages et al. ............... 455/127 |
| 6,185,432 | B1 | 2/2001 | Vembu |
| 6,191,653 | B1 | 2/2001 | Camp, Jr. et al. |
| 6,194,963 | B1 | 2/2001 | Camp, Jr. et al. ........... 330/149 |
| 6,198,347 | B1 | 3/2001 | Sander et al. |
| 6,201,452 | B1 | 3/2001 | Dent et al. |
| 6,215,355 | B1 | 4/2001 | Meck et al. |
| 6,219,394 | B1 | 4/2001 | Sander |
| 6,236,284 | B1 | 5/2001 | Duello et al. |
| 6,242,975 | B1 | 6/2001 | Eidson et al. |
| 6,246,286 | B1 | 6/2001 | Persson |
| 6,255,906 | B1 | 7/2001 | Eidson et al. |
| 6,259,901 | B1 | 7/2001 | Shinomiya et al. |
| 6,259,928 | B1 | 7/2001 | Vembu |
| 6,269,135 | B1 | 7/2001 | Sander |
| 6,272,336 | B1 | 8/2001 | Appel et al. ............... 455/423 |
| 6,285,251 | B1 | 9/2001 | Dent et al. |
| 6,288,916 | B1 | 9/2001 | Liu et al. |
| 6,294,957 | B1 | 9/2001 | Luu |
| 6,311,046 | B1 | 10/2001 | Dent |
| 6,317,608 | B1 | 11/2001 | Glöcker |
| 6,320,913 | B1 | 11/2001 | Nakayama ................ 375/297 |
| 6,321,072 | B1 | 11/2001 | Cipriani et al. |
| 6,323,731 | B1 | 11/2001 | McCune, Jr. |
| 6,330,462 | B1 | 12/2001 | Chen |
| 6,351,650 | B1 | 2/2002 | Lundby et al. |
| 6,353,364 | B1 | 3/2002 | Klemmer .................. 330/279 |
| 6,356,155 | B1 | 3/2002 | Judkins |
| 6,366,177 | B1 | 4/2002 | McCune et al. |
| 6,369,657 | B1 | 4/2002 | Dening et al. |
| 6,370,109 | B1 | 4/2002 | Schwartz et al. |
| 6,374,085 | B1 | 4/2002 | Saints et al. |
| 6,377,784 | B1 | 4/2002 | McCune |
| 6,380,802 | B1 | 4/2002 | Pehike et al. |
| 6,404,823 | B1 | 6/2002 | Grange et al. |
| 6,411,655 | B1 * | 6/2002 | Holden et al. ............. 375/297 |
| 6,421,327 | B1 | 7/2002 | Lundby et al. |
| 6,426,677 | B1 | 7/2002 | Prentice |
| 6,426,678 | B1 | 7/2002 | Ko |
| 6,430,402 | B1 | 8/2002 | Agahi-Kesheh |
| 6,445,247 | B1 | 9/2002 | Walker |
| 6,449,465 | B1 | 9/2002 | Gailus et al. |
| 6,480,472 | B1 | 11/2002 | Jou et al. |
| 6,490,460 | B1 | 12/2002 | Soliman |
| 6,628,165 | B1 | 9/2003 | Henderson et al. ........... 330/85 |
| 6,639,463 | B1 * | 10/2003 | Ghanadan et al. ...... 330/124 R |
| 6,701,134 | B1 | 3/2004 | Epperson ................... 455/102 |
| 6,738,432 | B1 * | 5/2004 | Pehlke et al. ........... 330/124 R |
| 6,751,265 | B1 * | 6/2004 | Schell et al. ................ 375/297 |
| 6,765,439 | B1 * | 7/2004 | Choi ...................... 330/124 R |
| 6,859,098 | B1 * | 2/2005 | Husseini .................... 330/136 |
| 2001/0026579 | A1 | 10/2001 | Mollenkopf et al. |
| 2003/0073419 | A1 | 4/2003 | Chadwick ................... 455/126 |
| 2003/0223510 | A1 | 12/2003 | Kurakami et al. .......... 375/297 |
| 2004/0192369 | A1 | 9/2004 | Nilsson ..................... 455/522 |
| 2005/0030104 | A1 | 2/2005 | Chen et al. ................. 330/295 |

OTHER PUBLICATIONS

Kozyrev, "Single-Ended Switching-Mode Tuned Power Amplifier with Filtering Circuit", Poluprovodnikovye pribory v tekhnike svyazi, 1971, pp. 152-166, vol. 6.

TimeStar™, "Multi-Mode Polar Modulator" 2002, Tropian Headquarters, USA.

Sundstrom, "Digital RF Power Amplifier Linearisers", 1995, Sweden.

Kenington, "Linearised RF Amplifier and Transmitter Techniques", Microwave Engineering Europe, Nov. 1998, pp. 35.

Mann, et al., "Increasing Talk-Time with Effecient Linear PAs", Presented at IEE Colloquim on Tetra Market and Technology Developments, Feb. 2000, London.

Mann, et al., "Increasing the Talk-Time of Mobile Radios with Effecient Linear Transmitter Architectures", Electronics & Communication Engineering Journal, Apr. 2001, pp. 65-76, vol. 13, No. 2.

Heimbach, "Digital Multimode Technology Redefines the Nature of RF Transmission", Applied Microwave & Wireless, Aug. 2001.

Swanson, "Digital AM Transmitters", IEEE Transactions on Broadcasting, Jun. 1989, pp. 131-133, vol. 35, No. 2.

Tropian-Products Main, www.tropain.com/products/, Copyright 2000-2001, Aug. 14, 2002.

"Tropian and Agilent Technologies announce collaboration on multi-band, multi-mode 2.5G transmitter solutions", Feb. 18, 2002, Connes, France.

"Tropian Awarded 8th U.S. Patent for Wireless Technology: Innovative RF Power Processing Circuit Architecture Achieves Speed and Accuracy in Polar Modulation," Aug. 6, 2001, Cupertino, California.

Dialog Web Command Mode, p. 1 of 1, Sep. 17, 2002, Record 03929207, Polar Modulators for 1 and 2 GHz Power Amplifier Correction, Nisbet, J.

Dialog Web Command Mode, p. 1 of 1, Sep. 17, 2002, Record 0326082, A new Class-AB Design, De Jager, et al., Electronics World 105, Dec. 1999, p. 982-7.

Dialog Web Command Mode, p. 1 of 1, Sep. 17, 2002, Record 2371235, Increasing the talk-time of mobile radios with efficient linear transmitter architectures, Mann et al., Electronics & Communication Engineering Journal, v. 13, No. 2, Apr. 2001 (p. 65-76).

Dialog Web Command Mode, p. 1 of 3, Sep. 17, 2002, Record 15595216, The big climate amplifier ocean circulation-sea-ice-storminess-dustiness-albedo, Broecker, Geophysical Monograph, 2001, 126, 53-56, etc.

Dialog Web Command Mode, p. 1 of 9, Sep. 19, 2002, Record 10872787, Out-of-band emissions of digital transmissions using Kahn EER technique, Rudolph, IEEE Transactions on Microwave Theory & Techniques, 2002, V 50, N 8, Aug. p. 1979-1983, etc.

Dialog Web Command Mode, p. 1 of 20, Sep. 17, 2002. Record 01239474, GSM players Eye Edge Despite Transmit Woes, Keenan, Electronic Engineering Times, 2002, n 1211, p. 6.

* cited by examiner

ADAPTIVE WIDEBAND DIGITAL AMPLIFIER FOR LINEARLY MODULATED SIGNAL AMPLIFICATION AND TRANSMISSION

FIELD OF THE INVENTION

This present invention relates generally to electromagnetic processing, and more particularly to the attenuation or amplification of electromagnetic waves.

BACKGROUND OF THE INVENTION

The controlled attenuation or amplification of electromagnetic waves has many uses. For example, intelligence may be conveyed along a wave by attenuating and/or amplifying ("modifying") electromagnetic wave characteristics, such as is seen when modulating amplitude, frequency or phase of an electrical current or radio frequency (RF) wave to transmit data. As another example, power may be conveyed along a wave in a controlled fashion by attenuating and/or amplifying electromagnetic wave characteristics, such as is seen when modulating voltage or current in a circuit. Moreover, the uses may be combined, such as when intelligence may be conveyed through a wave by modifying power characteristics.

Electromagnetic wave characteristic modification may be accomplished through digital or analog techniques. For instance, a wave may be switched off, and thus the wave attenuated completely; the voltage of a wave may be increased, such as by a factor of 1.5, and thus the wave regulated; etc. Digital and analog attenuation and/or amplification may also be combined, that is, the same wave may be subject to various types of digital and/or analog attenuation and/or amplification within a system in order to accomplish desired tasks.

Using digitization to process electromagnetic wave, such as in the amplification of a wave, has provided improved linearity of the processed wave, while at the same time also improving the efficiency of the process by reducing power consumption. Digitization also allows for the reduction of noise in the processed wave through the use of digital based techniques that are not available in analog processing systems.

Accordingly, it would be helpful to the art of electromagnetic wave modification if apparatus, methods, and articles of manufacture were provided that utilize digital techniques in the processing of electromagnetic waves.

SUMMARY OF THE INVENTION

An embodiment of the present invention comprises an apparatus including an amplitude mapping circuit for converting at least a portion of an amplitude signal to a binary value and a plurality of amplifiers coupled to the amplitude mapping circuit, such that the binary value is transmitted to at least one of the plurality of amplifiers to specify a gain level of the amplifier.

An embodiment of the present invention also comprises a method for processing a signal, comprising the steps of separating the signal into amplitude and phase components, generating a binary representation of at least a portion of the amplitude component, and specifying a gain level of one of a plurality of amplifiers in response to the generated binary representation.

DETAILED DESCRIPTION

The term "signal" as used herein should be broadly construed to include any manner of conveying data from one place to another, such as, for example, an electric current or electromagnetic field, including without limitation, a direct current that is switched on and off or an alternating-current or electromagnetic carrier that contains one or more data streams. Data, for example, may be superimposed on a carrier current or wave by means of modulation, which may be accomplished in analog or digital form. The term "data" as used herein should also be broadly construed to comprise any type of intelligence or other information, such as, for example and without limitation, audio, voice, text and/or video, etc.

Figure 1:
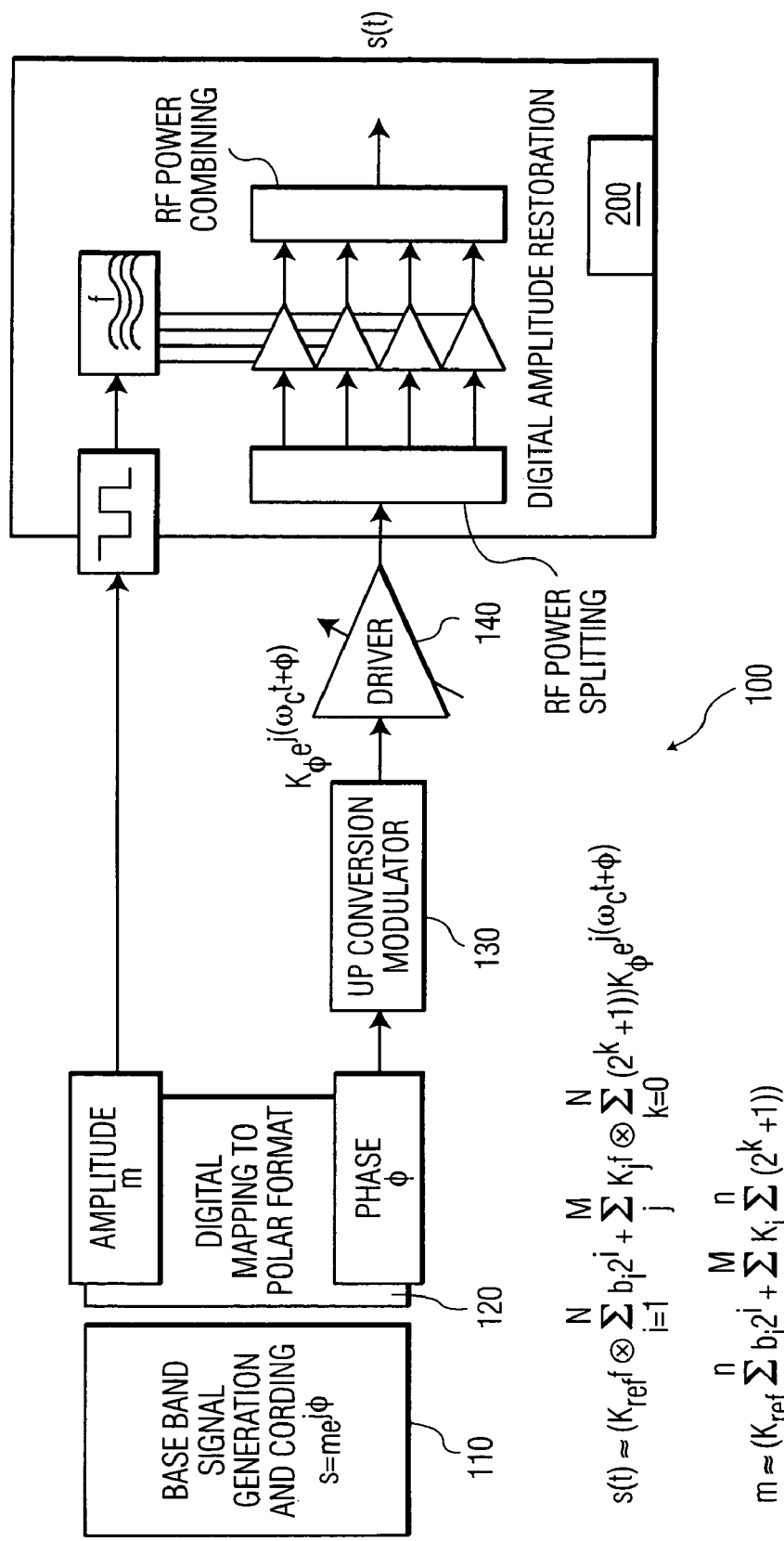
FIG. 1 shows a signal transmission apparatus according to an exemplary embodiment of the present invention.

In an exemplary embodiment, a wave may be divided into two component characteristics. This wave may be an input wave, for example, to an electromagnetic signal transmitter, receiver, or transceiver. As shown in FIG. 1, the input wave may be divided into a magnitude component (m) comprising magnitude characteristics of the input wave over a defined period and a phase component ($\phi$), comprising phase characteristics of the input wave over the same period. If the input wave is defined by the following equation:

$$s(t) = I(t) + jQ(t) = m(t)e^{j\phi(t)}$$

Then the magnitude component (m) and the phase component ($\phi$) may be defined by the following equations:

$$m(t) = \sqrt{I^2(t) + Q^2(t)} \quad \text{and} \quad \varphi(t) = \arctan\left(\frac{Q(t)}{I(t)}\right)$$

The manner in which the input wave is divided is not particularly limited. One exemplary manner in which this may be accomplished is to provide an input wave to a digital signal processor, which digitizes the wave, such as by the use of rectangular coordinates or In-Phase (I), Quadrature Phase (Q) data. A rectangular to polar converter then receives the I,Q data and translates it into polar coordinates.

It should be noted that, in other embodiments, a different digitized representation of a wave may be provided if desired. While the invention is described herein in connection with an embodiment using a digitized wave with polar data, those of ordinary skill in the art will appreciate that the invention is not limited thereto and may use any digital or analog waveform, or combination thereof.

It should be noted that the time period in this and other embodiments is as desired. For example, embodiments may derive magnitude and phase characteristics of the wave over various time periods in order to maximize resolution of the wave, maximize speed of operation, etc. These time periods may be dynamically determined as well in various embodiments so that they change during operation. In the preferred embodiments, the division of the input wave is synchronized, in order to maximize accuracy of output and minimize any distortion.

FIG. 1 shows a signal transmission apparatus 100 according to a first exemplary embodiment of the invention. An input wave I is initially provided to, or generated by, base band signal generation and coding portion 110. The base band signal generation and coding portion 110 preferably digitizes an input analog wave (e.g., converts from analog to digital) and/or directly process digital data, and may additionally provide necessary coding, such variation by a pseudo-random sequence (as is typically done in Code Division Multiple Access (CDMA)).

After the input wave I has been processed (e.g., digitized and coded), the base band signal generation and coding portion 110 provides the processed signal (analog or digital) to a rectangular to polar converter 120 which separates the signal into amplitude (m) and phase (φ) components. From that point, the amplitude component (m) of the signal is provided to an amplitude mapping portion 210 of a digital amplitude restoration circuit 200 (See FIG. 2). The amplitude mapping portion 210 converts the amplitude signal into a specific number of bits ($b_1$–$b_n$). For example, for 32 bits, the amplitude mapping portion 210 would convert the amplitude signal into bits $b_1$–$b_{32}$.

As discussed above, the amplitude portion (m) of the original input wave I may be converted into digital pulses comprising a digital word (DW) quantized into bits $b_1$ to $b_n$, with a Most Significant Bit ("MSB") to Least Significant Bit ("LSB"). The digital word DW may be as of varying lengths in various embodiments (e.g., 32 bits, 128 bits, etc.). In general, the longer the word the greater the accuracy of reproduction ("resolution") of the input wave. The digital word DW provides instruction signals for processing of the wave, such as for attenuation and/or amplification, in manner to be described further below. Of course, as is described further below, in other embodiments, a differently composed digital word DW may be used, as well as other types of derivation of amplitude or other wave characteristics.

Returning to FIG. 1, the phase component (φ) of the input wave is modulated onto a carrier wave, preferably a radiofrequency (RF) signal, by phase modulator 130. This carrier-modulated wave preferably has a constant envelope (i.e., no amplitude variations), yet it has phase characteristic information of the original input wave. The carrier-modulated phase component (φ) of the input wave is then provided to a variable gain amplifier 140 which prepares the wave for power splitter 250 of the digital amplitude restoration circuit 200. Although the above discussion concerns modulation of an input wave with a phase modulator, those of ordinary skill in the art will realize that other methods of modulation are equally as applicable (such as up conversion with mixer(s)).

Figure 2:
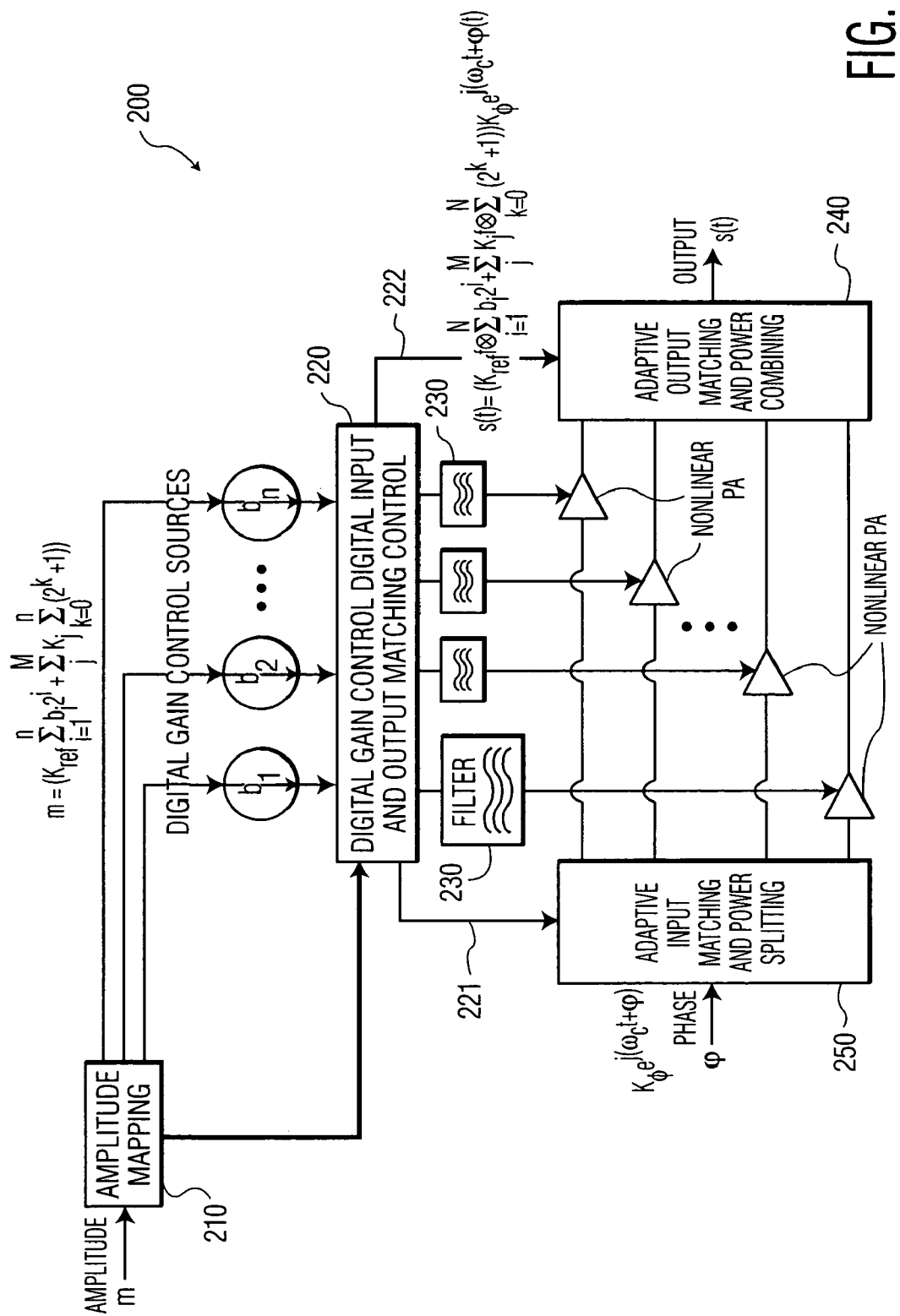
FIG. 2 shows a digital amplitude restoration section of the signal transmission apparatus shown in FIG. 1.

Power splitter 250 divides the carrier-modulated phase component (φ) of the input wave into a plurality of segments $S_{1-M}$ which are processed by a digital amplitude restoration circuit 200 (See FIG. 2). Those of ordinary skill in the art will recognize that the number of segments into which the carrier-modulated phase component (φ) of the input wave is divided is variable and depends upon the particular quantization scheme and the amplitude level of the input signal. The power splitter 250 also provides impedance matching between the circuitry transmitting the carrier-modulated phase component, and the plurality of segments $S_1$–$S_M$. As those of ordinary skill in the art will realize, the digital amplitude restoration circuit 200 may be implemented with discrete circuits, with integrated circuits, or with hybrid circuits.

FIG. 2 shows a digital amplitude restoration circuit 200 which is part of the signal transmission apparatus 100. As discussed above, the digital amplitude restoration circuit 200 includes a amplitude mapping portion 210 for converting the amplitude portion (m) of the input signal into a digital words DWs, each of a specific number of bits ($b_1$–$b_n$). Each digital word DW is representative of at least a portion of the amplitude portion (m) of the input signal. The digital word DWs are provided to a digital gain control circuit 220 which provides gain control signals to respective amplifiers $PA_1$–$PA_M$ in the plurality of segments $S_1$–$S_M$ through a plurality of noise filters 230. The noise filters 230 remove any noise introduced in the conversion of the amplitude portion (m) into the digital words DWs as needed. As noted above, the digital amplitude restoration circuit 200 also includes a power splitter 250 for splitting the carrier-modulated phase component into plurality of segments $S_1$–$S_M$ and providing impedance matching, and power combiner 240 for recombining the plurality of segments $S_1$–$S_M$ into a unitary output signal and providing impedance matching.

Besides providing gain control signals to the plurality of segments $S_1$–$S_M$, the digital gain control circuit 220 also provides input and output control signals 221, 222. Input control signal 221 controls the portion of the power of the carrier-modulated phase component supplied to each of the segments $S_1$–$S_M$, and the output control signal 222 controls the recombination of the segments $S_1$–$S_M$ so that they are recombined in the same manner in which they were divided. The input control signal 221 varies the portion of the carrier-modulated phase portion (φ) of the input signal supplied to each segment $S_1$–$S_M$ depending upon the value of the digital words DWs generated by the amplitude mapping circuit 210.

As noted above, the control terminal of each segment $S_1$–$S_M$ is coupled to the digital gain control circuit 220 such that the digital word DWs can be used to set the gain of each of the amplifiers. The amplitude signal (m) is quantized using the n-bit gain (provided by bits $b_1$–$b_n$) and M segments to yield a signal according to the following equation:

$$m = \left( K_{ref} \sum_{i=1}^{n} b_i 2^i + \sum_{j}^{M} K_j \left( \sum_{k=0}^{n} 2^k + 1 \right) \right),$$

where, $K_{ref}$ is the reference gain of each bit $b_1$–$b_n$, $K_j$ is the segment gain of the $j^{th}$ segment when more than one segment is used, and M is the total number of segments. For uniform quantization, $K_{ref}=K_j$ for segments that are biased "ON" (e.g., receiving a logic "1" at the control terminal of the segment), and $K_j=0$ for the segments that are biased "OFF" (e.g., receiving a logic "0" at the control terminal of the segment).

In an exemplary implementation according to the first embodiment of the present invention, the digital word DWs generated by the amplitude mapping portion 210 are each 5-bit (e.g., each with bits $b_1$–$b_5$), and the digital amplitude restoration circuit 200 includes four (4) segments $S_1$–$S_4$ (with corresponding amplifiers $PA_1$–$PA_4$). Using 5-bit digital words DWs to represent the amplitude portion (m) of the input signal, each amplifier $PA_1$–$PA_4$ can specify one of 32 gain levels (e.g., $2^5=32$ possible binary combinations for each digital word DW). With four (4) segments $S_1$–$S_4$ and 5-bit digital words DWs, the digital amplitude restoration circuit 200 can represent any quantization level between 1 and 128 (i.e., each of the four segments $S_1$–$S_4$ can represent a gain level of up to 32).

Continuing with the above example, if an instantaneous amplitude value of the amplitude portion (m) of the input signal is set to the decimal quantization value "70". In this case M=4, n=5, and $K_j$=0 for j=4, then the amplitude mapping portion 210 would first load a five-bit representation of the $32^{nd}$ gain level into the control terminal of the amplifier $PA_1$ and $PA_2$. The amplitude mapping portion 210 would then successively load, a five-bit representation of the number $32^{nd}$ gain level into the control terminal of the amplifier $PA_3$, a five-bit representation of the $6^{th}$ gain level (e.g., 00110) into the control terminal of the amplifier $PA_3$, and amplifier $PA_4$ is biased 'OFF'.

Figure 3:
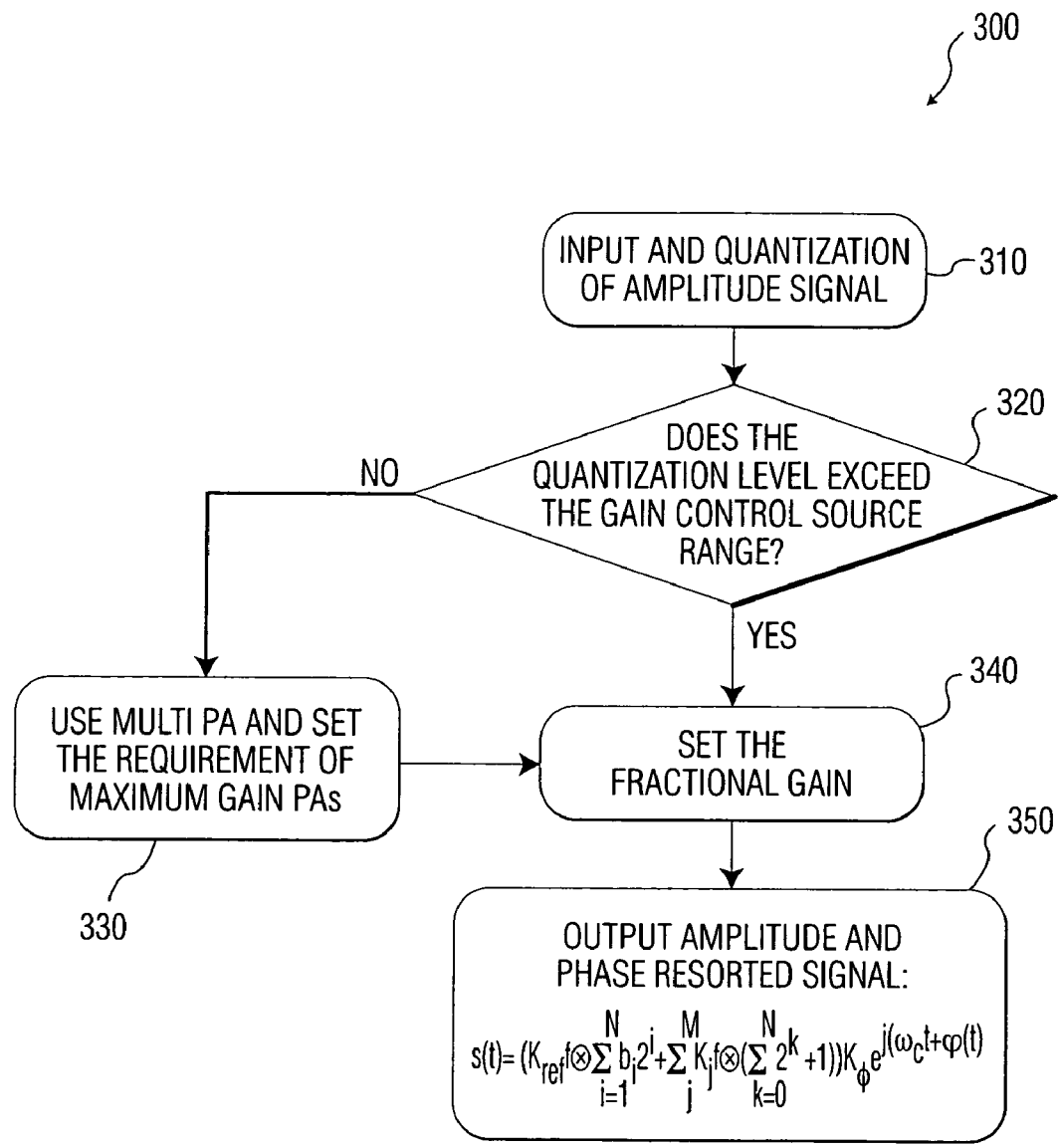
FIG. 3 is a flow chart showing the process for setting the gain of the signal transmission apparatus.

FIG. 3 shows a flow chart describing the process 300 for setting the gain of the respective amplifiers $PA_1$–$PA_n$. As discussed above, the amplitude portion (m) of the input signal is first quantized by the amplitude mapping circuit 210 at step 310. If the quantization level of the input amplitude signal is greater than the gain control range of an individual amplifier PA (step 320), then the process proceeds to utilizing multiple amplifiers (step 330). However, if the quantization level of the input amplitude signal is less than the gain control range of an individual amplifier PA (step 320), the gain of the amplifier is set directly (step 340). Obviously, if the quantization level of the input amplitude signal is greater than the gain control range of an individual amplifier PA, then a certain number of amplifiers will need to be selected at step 330, before the gain of each amplifier is set at step 340. Once the number of amplifiers, and the gain of each amplifier, is set, the process outputs the restored signal s(t) at step 350. The restored signal s(t) has the amplitude portion (m) and the phase portion ($\phi$) recombined.

Using the above example, the quantization level "70" is greater than the gain control range of an individual amplifier PA (e.g., 0–32). Thus, multiple amplifiers must be used to achieve the quantization level. Since "70" may be divided by 32 at least two (2) times, at least two amplifiers PA must be used. Using two amplifiers achieves the quantization level of "64", and thus one additional amplifier must be used to achieve the additional six (6) levels. Accordingly, the first two amplifiers (e.g., $PA_1$, $PA_2$) would have a gain of 32 (the maximum gain), and the third amplifier (e.g., $PA_3$) would have a gain of 6. In the above example amplifier $PA_4$ is unnecessary to achieve the quantization level of 70, and thus is unused.

Input control signal 221 issued by the digital gain control circuit 200 controls the power splitter 250 to divide the power of portion of the carrier-modulated phase component corresponding to the portion of the amplitude component being restored by the digital amplitude restoration circuit 200 accordingly with the number of amplifiers utilized. For example, using the above-described scenario would result in a power division between three (3) different amplifiers (e.g., $PA_1$–$PA_3$). However, the first two amplifiers (e.g., $PA_1$, $PA_2$) are at maximum gain and thus should receive more of the power of the carrier-modulated phase component than the third amplifier (e.g., $PA_3$). The power splitter 250 will evenly distribute the carrier-modulated phase portion ($\phi$) of the input signal to amplifiers $PA_1$–$PA_n$ that are ON. Similarly, the power combiner 240 will finalize the amplitude restoration and deliver the modulated and amplified signal s(t) as defined by the following equation:

$$s(t) = \left( K_{ref} f \otimes \sum_{i=1}^{N} b_i 2^i + \sum_{j}^{M} K_j f \otimes \left( \sum_{k=0}^{N} 2^k + 1 \right) \right) K_\phi e^{j(\omega_c t + \varphi(t))}$$

Where f is the filters required for 'potential noise limit' requirements. As will be understood by those of ordinary skill in the art, the 'potential noise limit' will be different for different applications. For example, in a Frequency Division Duplex (FDD) wireless system (e.g., CDMA, WCDMA, WLAN), transmitter and receiver operate at the same time. Therefore, the transmitter 'potential noise limit' requirement in the receiver band is more restrictive in an FDD system than in a Time Division Duplex (TDD) wireless system (e.g., GSM, TDMA).

Although the invention has been described in terms of exemplary embodiments, it is not limited thereto. Rather, the appended claims should be construed broadly to include other variants and embodiments of the invention which may be made by those skilled in the art without departing from the scope and range of equivalents of the invention.

What is claimed is:

1. An apparatus comprising:
an amplitude mapping circuit for converting at least a portion of an amplitude signal to a binary value;
a plurality of gain control sources coupled to the amplitude mapping circuit; and,
a plurality of amplifiers coupled to at least one of the plurality of gain control sources,
wherein the binary value is transmitted to at least one of the plurality of amplifiers by at least one of the plurality of gain control sources to specify a gain level of the amplifier.

2. The apparatus of claim 1, further comprising:
a rectangular to polar converter for converting a signal into amplitude and phase portions, and for transmitting said amplitude portion to the amplitude mapping circuit.

3. The apparatus of claim 2, further comprising:
a phase modulator for modulating the phase portion with a carrier signal.

4. The apparatus of claim 2, further comprising:
a modulator for modulating the phase portion with a carrier signal.

5. The apparatus of claim 1, further comprising:
an input matching circuit coupled to the respective inputs of the plurality of amplifiers; and
an output matching circuit coupled to the respective outputs of the plurality of amplifiers.

6. A method for processing a signal, comprising the steps of:
separating the signal into amplitude and phase components;
generating a binary representation of at least a portion of the amplitude component; and,
applying said binary representation to at least one of a plurality of gain control sources;
specifying a gain level of one of a plurality of amplifiers in response to the generated binary representation.

* * * * *